(12) United States Patent
Khlat et al.

(10) Patent No.: US 10,122,323 B2
(45) Date of Patent: Nov. 6, 2018

(54) EFFICIENT WIDE BANDWIDTH ENVELOPE TRACKING POWER SUPPLY

(71) Applicant: Qorvo US, Inc., Greensboro, NC (US)

(72) Inventors: Nadim Khlat, Cugnaux (FR); Baker Scott, San Jose, CA (US); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/477,246

(22) Filed: Apr. 3, 2017

(65) Prior Publication Data

US 2017/0288612 A1  Oct. 5, 2017

Related U.S. Application Data

(60) Provisional application No. 62/317,683, filed on Apr. 4, 2016.

(51) Int. Cl.
| | |
|---|---|
| *H03G 3/20* | (2006.01) |
| *H03F 1/02* | (2006.01) |
| *H03F 3/19* | (2006.01) |
| *H03F 3/24* | (2006.01) |
| *H03F 1/48* | (2006.01) |

(52) U.S. Cl.
CPC ........... *H03F 1/0244* (2013.01); *H03F 1/486* (2013.01); *H03F 3/19* (2013.01); *H03F 3/245* (2013.01); *H03F 2200/102* (2013.01); *H03F 2200/375* (2013.01); *H03F 2200/451* (2013.01); *H03F 2200/507* (2013.01); *H03F 2200/555* (2013.01)

(58) Field of Classification Search
CPC .... H03F 1/0211; H03F 1/0233; H03F 1/0244; H03F 1/0255
USPC .................................................. 330/127, 297
See application file for complete search history.

(56) References Cited

U.S. PATENT DOCUMENTS

2013/0134956 A1* 5/2013 Khlat ....................... G05F 3/02
323/304

* cited by examiner

*Primary Examiner* — Steven J Mottola
(74) *Attorney, Agent, or Firm* — Withrow & Terranova, P.L.L.C.

(57) ABSTRACT

An envelope tracking power supply, which includes a parallel amplifier, switching circuitry, and a parallel switching supply, is disclosed. The envelope tracking power supply provides an envelope power supply signal to a load. The parallel amplifier regulates an envelope power supply voltage of the envelope power supply signal based on a setpoint of the envelope power supply voltage. The switching circuitry at least partially provides the envelope power supply signal via a first inductive element and drives an output current from the parallel amplifier toward zero. The parallel switching supply provides an assist current to further drive the output current from the parallel amplifier toward zero based on an estimate of a current in the first inductive element and an estimate of a current in the load.

19 Claims, 9 Drawing Sheets

EFFICIENT WIDE BANDWIDTH ENVELOPE TRACKING POWER SUPPLY

RELATED APPLICATIONS

This application claims the benefit of U.S. provisional patent application No. 62/317,683, filed Apr. 4, 2016, the disclosure of which is incorporated herein by reference in its entirety.

FIELD OF THE DISCLOSURE

Embodiments of the present disclosure relate to linear amplifier based power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

An envelope tracking power supply, which includes a parallel amplifier, switching circuitry, and a parallel switching supply, is disclosed according to one embodiment of the present disclosure. The envelope tracking power supply provides an envelope power supply signal to a load. The parallel amplifier regulates an envelope power supply voltage of the envelope power supply signal based on a setpoint of the envelope power supply voltage. The switching circuitry at least partially provides the envelope power supply signal via a first inductive element and drives an output current from the parallel amplifier toward zero. The parallel switching supply provides an assist current to further drive the output current from the parallel amplifier toward zero based on an estimate of a current in the first inductive element and an estimate of a current in the load.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

An envelope tracking power supply, which includes a parallel amplifier, switching circuitry, and a parallel switching supply, is disclosed according to one embodiment of the present disclosure. The envelope tracking power supply provides an envelope power supply signal to a load. The parallel amplifier regulates an envelope power supply voltage of the envelope power supply signal based on a setpoint of the envelope power supply voltage. The switching circuitry at least partially provides the envelope power supply signal via a first inductive element and drives an output current from the parallel amplifier toward zero. The parallel switching supply provides an assist current to further drive the output current from the parallel amplifier toward zero based on an estimate of a current in the first inductive element and an estimate of a current in the load.

Figure 1:
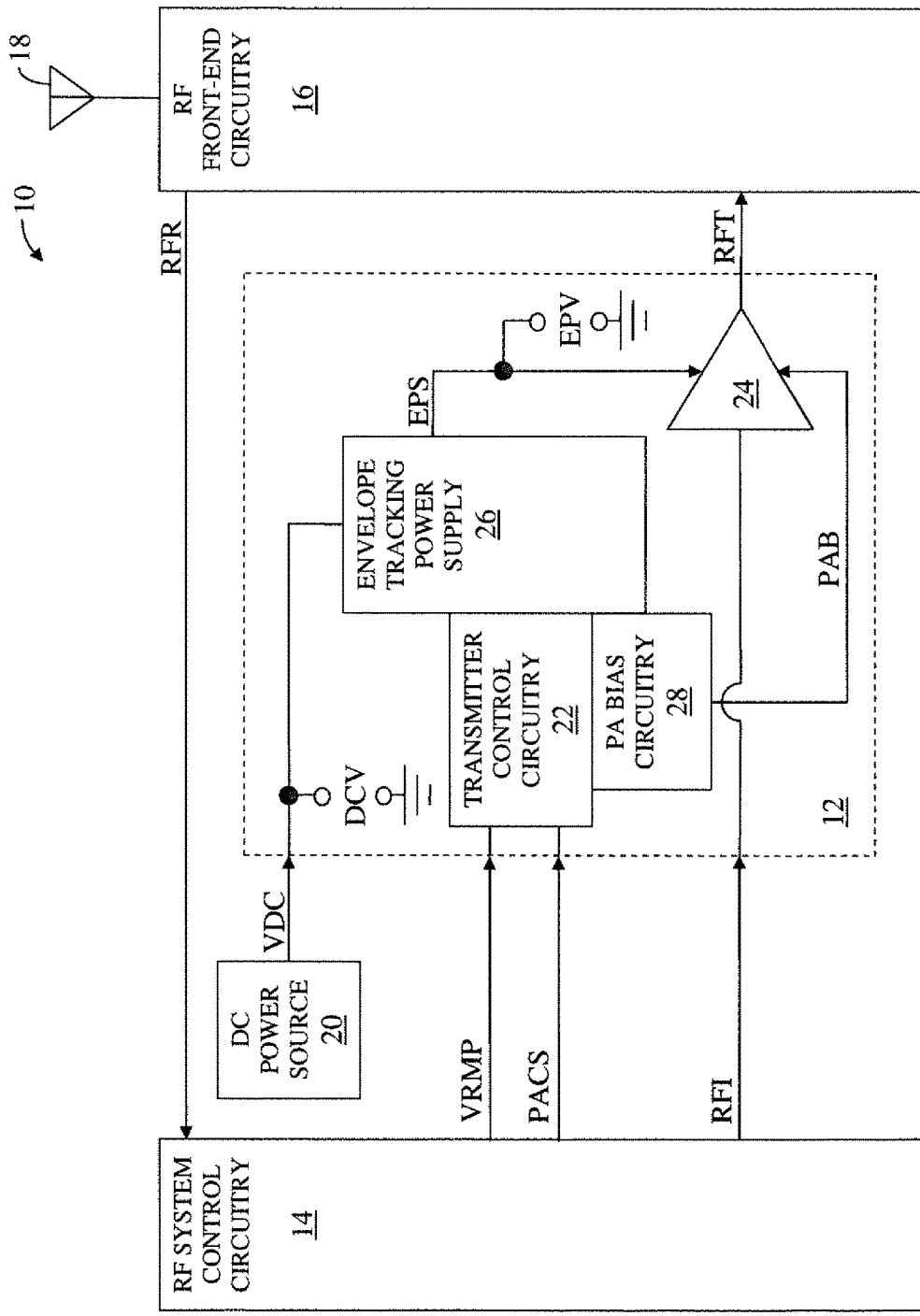
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. The DC source signal VDC has a DC source voltage DCV. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. In general, the envelope tracking power supply 26 provides an envelope power supply signal EPS to a load 46 (FIG. 4) based on the envelope power supply control signal VRMP. In one embodiment of the load 46 (FIG. 4), the load 46 (FIG. 4) includes the RF PA 24. The envelope power supply signal EPS has an envelope power supply voltage EPV. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. In one embodiment of the envelope power supply control signal VRMP, the envelope power supply control signal VRMP is representative of a setpoint of the envelope power supply voltage EPV. The RF PA 24 receives and amplifies the RF input signal RFI to provide an RF transmit signal RFT using the envelope power supply signal EPS. The envelope power supply signal EPS provides power for amplification. In one embodiment of the RF PA 24, the RF PA 24 receives and amplifies the RF input signal RFI to provide the RF transmit signal RFT using the envelope power supply voltage EPV. The envelope power supply voltage EPV provides power for amplification.

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
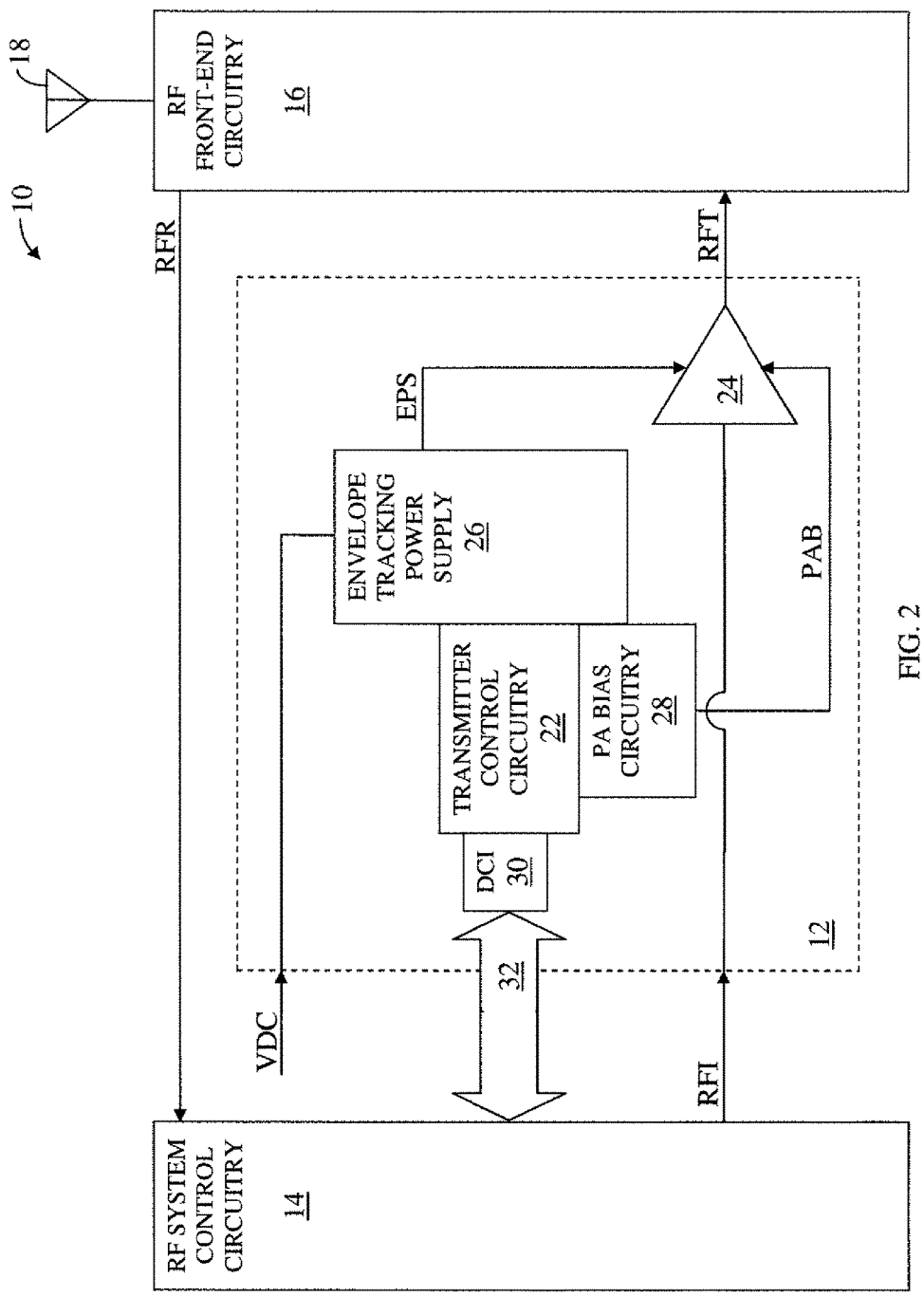
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
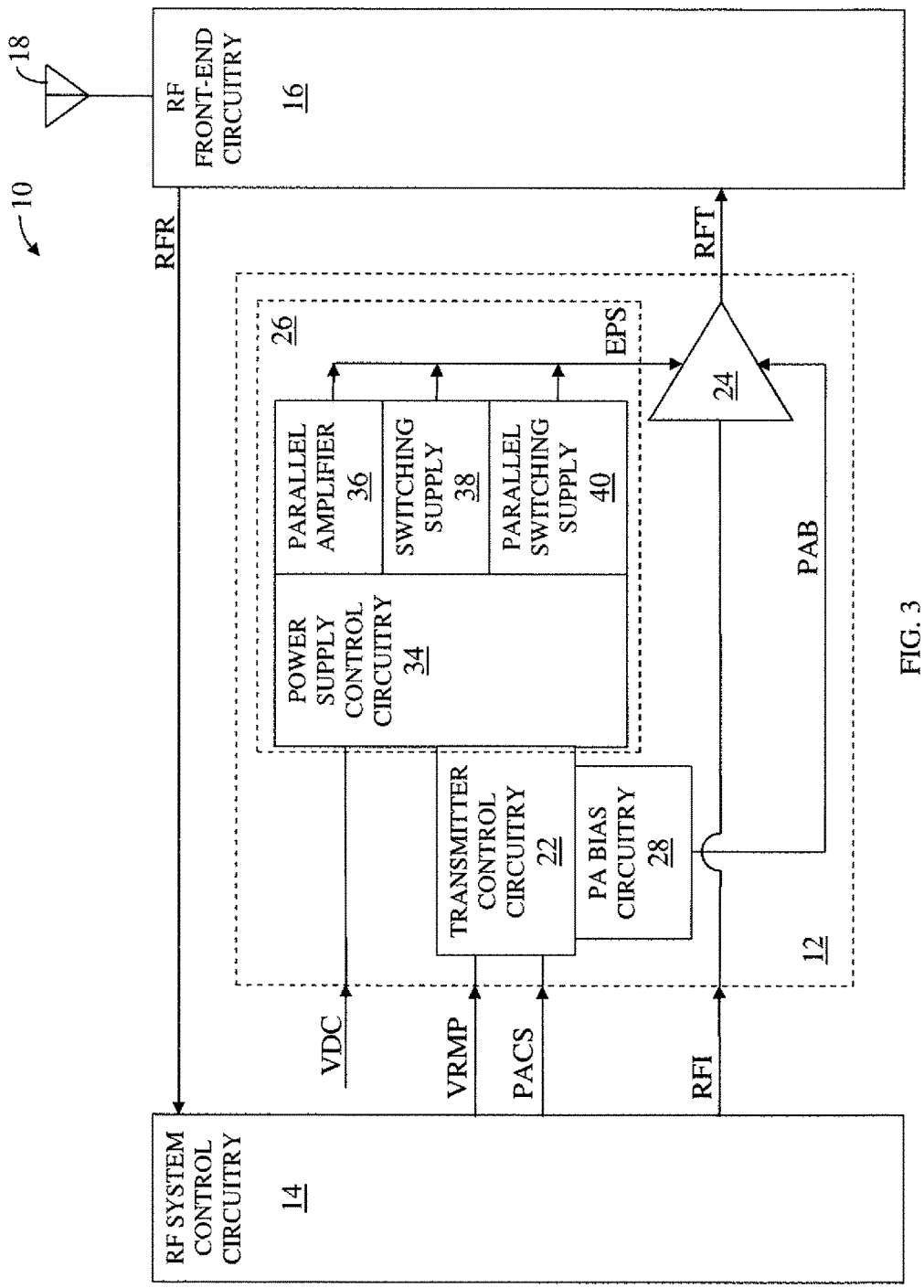
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a parallel amplifier 36, a switching supply 38, and a parallel switching supply 40. The power supply control circuitry 34 is coupled to the transmitter control circuitry 22, the parallel amplifier 36 is coupled to the power supply control circuitry 34, the switching supply 38 is coupled to the power supply control circuitry 34, and the parallel switching supply 40 is coupled to the power supply control circuitry 34. The transmitter control circuitry 22 may forward the envelope power supply control signal VRMP to the power supply control circuitry 34.

Since the envelope power supply control signal VRMP is representative of the setpoint of the envelope power supply signal EPS, the power supply control circuitry 34 controls the parallel amplifier 36, the switching supply 38, and the parallel switching supply 40 based on the setpoint of the envelope power supply signal EPS. As such, the parallel amplifier 36, the switching supply 38, and the parallel switching supply 40 provide the envelope power supply signal EPS. The switching supply 38 may provide power more efficiently than both the parallel amplifier 36 and the parallel switching supply 40. However, the parallel amplifier 36 may provide the envelope power supply signal EPS more accurately than the both the switching supply 38 and the parallel switching supply 40. Further, the parallel switching supply 40 may provide the envelope power supply signal EPS more efficiently than the parallel amplifier 36 and more accurately than the switching supply 38.

In one embodiment of the envelope tracking power supply 26, a bandwidth of the parallel amplifier 36 is greater than a bandwidth of the parallel switching supply 40 and the bandwidth of the parallel switching supply 40 is greater than a bandwidth of the switching supply 38. In an exemplary embodiment of the envelope tracking power supply 26, the bandwidth of the parallel amplifier 36 is greater than 40 megahertz, the bandwidth of the parallel switching supply 40 is less than 40 megahertz and greater than 8 megahertz, and the bandwidth of the switching supply 38 is less than 8 megahertz.

In general, in one embodiment of the envelope tracking power supply 26, the parallel amplifier 36 at least partially provides the envelope power supply signal EPS, the switching supply 38 at least partially provides the envelope power supply signal EPS, and the parallel switching supply 40 at least partially provides the envelope power supply signal EPS.

Figure 4:
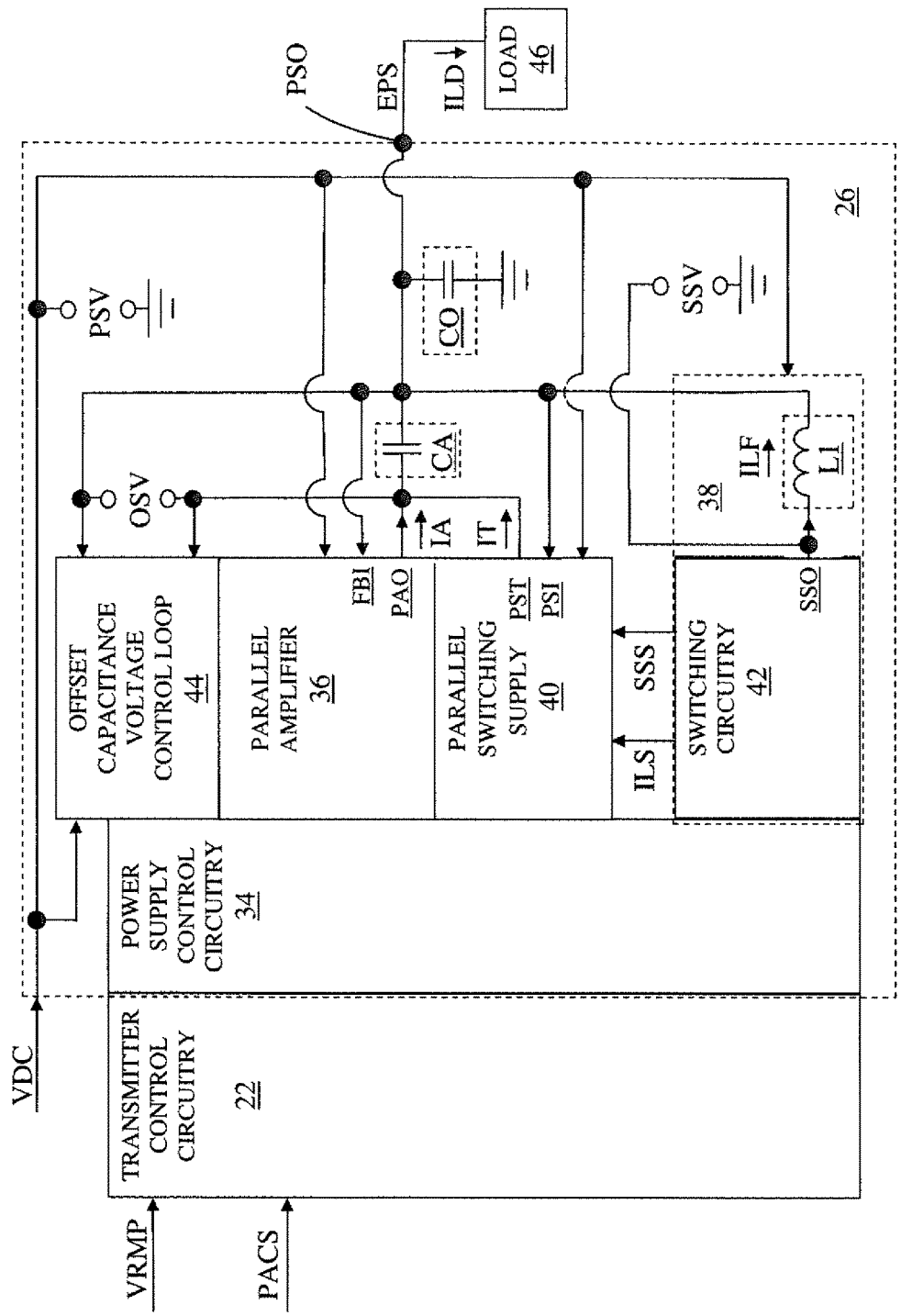
FIG. 4 shows details of the envelope tracking power supply illustrated in FIG. 3 and further shows a load and transmitter control circuitry according to one embodiment of the load and the transmitter control circuitry, and an alternate embodiment of the envelope tracking power supply.

In this regard, in one embodiment of the envelope tracking power supply 26, the parallel amplifier 36 regulates the envelope power supply voltage EPV (FIG. 1) based on the setpoint of the envelope power supply voltage EPV (FIG. 1), the switching supply 38 operates to drive an output current from the parallel amplifier 36 toward zero to maximize efficiency. As such, the parallel amplifier 36 behaves like a voltage source and the switching supply 38 behaves like a current source. In one embodiment of the envelope tracking power supply 26, the parallel switching supply 40 further drives the output current from the parallel amplifier 36 toward zero based on an estimate of a first inductive element current ILF (FIG. 4) in a first inductive element L1 (FIG. 4) and an estimate of a load current ILD (FIG. 4) in the load 46 (FIG. 4).

Figure 6:
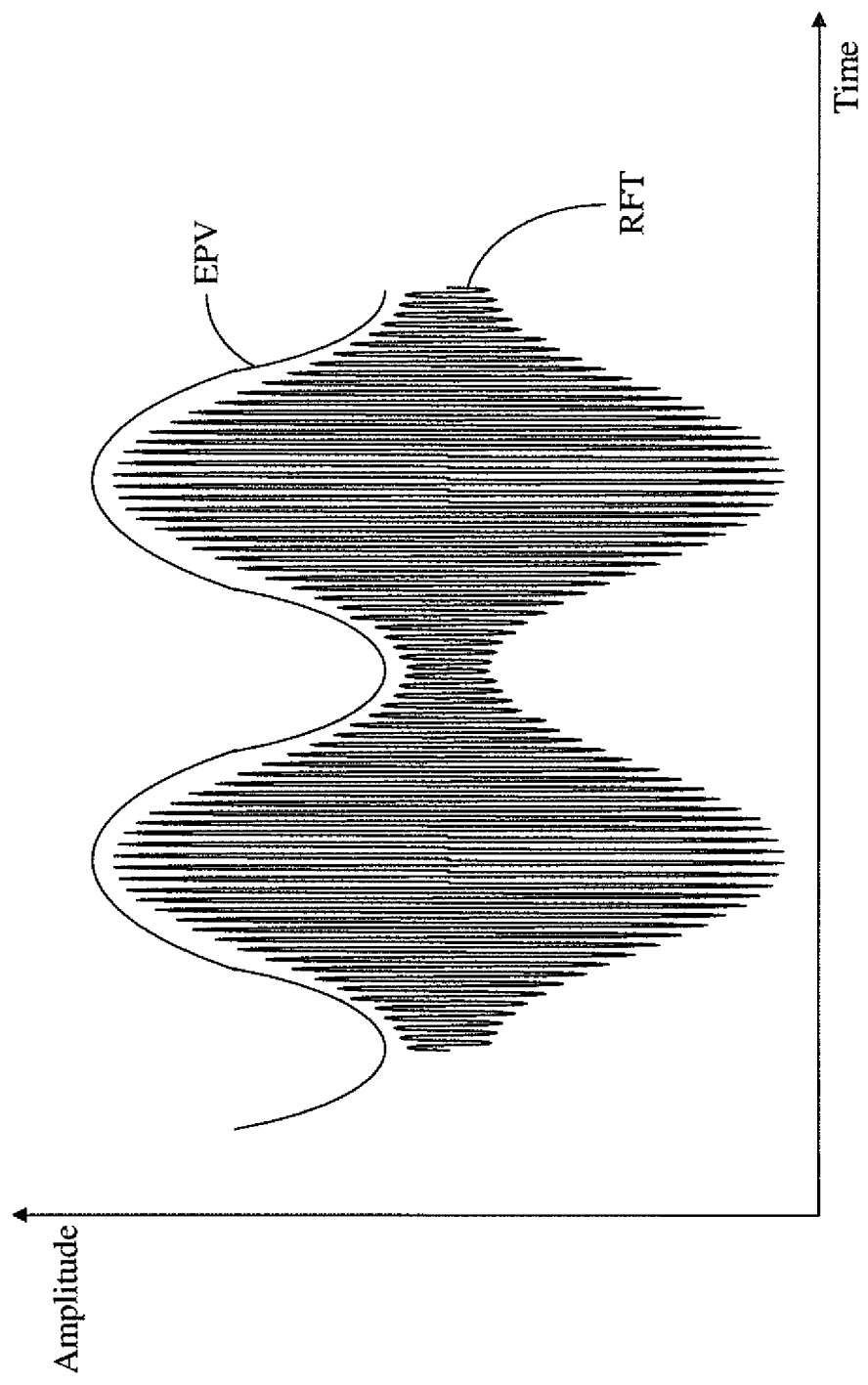
FIG. 6 is a graph illustrating an RF transmit signal and an envelope power supply voltage shown in FIGS. 1 and 4 according to one embodiment of the RF transmit signal and the envelope power supply voltage.

As previously mentioned, in one embodiment of the RF communications system 10, the RF PA 24 receives and amplifies the RF input signal RFI to provide the RF transmit signal RFT using the envelope power supply signal EPS, which provides power for amplification. In one embodiment of the RF input signal RFI, the RF input signal RFI is amplitude modulated. As such, the RF transmit signal RFT is also amplitude modulated, as illustrated in FIG. 6. Since the amplitude of the RF transmit signal RFT is modulated, the amplitude of the RF transmit signal RFT traverses within an envelope of the RF transmit signal RFT. For proper operation of the RF PA 24, the envelope power supply voltage EPV (FIGS. 1 and 6) must be high enough to accommodate the envelope of the RF transmit signal RFT. However, to increase efficiency in the RF PA 24, the envelope power supply voltage EPV (FIG. 1) may at least partially track the envelope of the RF transmit signal RFT. This tracking by the envelope power supply voltage EPV is called envelope tracking.

In this regard, since the envelope power supply control signal VRMP is representative of the setpoint of the envelope power supply signal EPS, the envelope power supply control signal VRMP may be received and amplitude modulated to provide at least partial envelope tracking of the RF transmit signal RFT by causing the envelope power supply voltage EPV (FIG. 1) to be amplitude modulated.

In a first embodiment of the envelope power supply control signal VRMP, a bandwidth of the envelope power supply control signal VRMP is greater than 10 megahertz. In a second embodiment of the envelope power supply control signal VRMP, the bandwidth of the envelope power supply control signal VRMP is greater than 40 megahertz. In a third embodiment of the envelope power supply control signal VRMP, the bandwidth of the envelope power supply control signal VRMP is greater than 60 megahertz. In a fourth embodiment of the envelope power supply control signal VRMP, the bandwidth of the envelope power supply control signal VRMP is greater than 80 megahertz. In a fifth embodiment of the envelope power supply control signal VRMP, the bandwidth of the envelope power supply control signal VRMP is greater than 100 megahertz. In an alternate embodiment of the envelope power supply control signal VRMP, the bandwidth of the envelope power supply control signal VRMP is less than 200 megahertz.

FIG. 4 shows details of the envelope tracking power supply 26 illustrated in FIG. 3 and further shows the load 46 according to one embodiment of the load 46 and an alternate embodiment of the envelope tracking power supply 26. The envelope tracking power supply 26 illustrated in FIG. 4 is similar to the envelope tracking power supply 26 illustrated in FIG. 3, except in the envelope tracking power supply 26 illustrated in FIG. 4, the switching supply 38 includes switching circuitry 42 and a first inductive element L1. The envelope tracking power supply 26 further includes an offset capacitance voltage control loop 44, an offset capacitive element CA, and an output filter capacitive element CO. In one embodiment of the envelope tracking power supply 26, the DC power source 20 (FIG. 1) provides operating power to the parallel amplifier 36, the switching supply 38, the parallel switching supply 40, and the offset capacitance voltage control loop 44 via the DC source signal VDC.

The envelope tracking power supply 26 has an envelope power supply output PSO, such that the envelope power supply signal EPS is provided via the envelope power supply output PSO. As previously mentioned, the envelope power supply signal EPS has the envelope power supply voltage EPV (FIG. 1). The parallel amplifier 36 has a parallel amplifier feedback input FBI and a parallel amplifier output PAO. The switching circuitry 42 has a switching circuitry output SSO. The parallel switching supply 40 has a parallel switching supply output PST and a parallel switching supply feedback input PSI.

In one embodiment of the envelope tracking power supply 26, the envelope tracking power supply 26 provides the envelope power supply signal EPS to the load 46 via the envelope power supply output PSO. In one embodiment of the envelope tracking power supply 26, the first inductive element L1 is coupled between the switching circuitry 42 and the envelope power supply output PSO using other intervening elements (not shown). In one embodiment of the envelope tracking power supply 26, the first inductive element L1 is directly coupled between the switching circuitry 42 and the envelope power supply output PSO.

In one embodiment of the envelope tracking power supply 26, the parallel amplifier feedback input FBI is coupled to the parallel switching supply feedback input PSI using other intervening elements (not shown). In one embodiment of the envelope tracking power supply 26, the parallel amplifier output PAO is coupled to the parallel switching supply output PST using other intervening elements (not shown). In one embodiment of the envelope tracking power supply 26, the parallel amplifier feedback input FBI is directly coupled to the parallel switching supply feedback input PSI. In one embodiment of the envelope tracking power supply 26, the parallel amplifier output PAO is directly coupled to the parallel switching supply output PST.

In one embodiment of the envelope tracking power supply 26, the offset capacitive element CA is coupled between the parallel amplifier output PAO and the parallel amplifier feedback input FBI using other intervening elements (not shown). In one embodiment of the envelope tracking power supply 26, the offset capacitive element CA is directly coupled between the parallel amplifier output PAO and the parallel amplifier feedback input FBI. In one embodiment of the envelope tracking power supply 26, the offset capacitive element CA is coupled between the parallel switching supply output PST and the parallel switching supply feedback input PSI using other intervening elements (not shown). In one embodiment of the envelope tracking power supply 26, the offset capacitive element CA is directly coupled between the parallel switching supply output PST and the parallel switching supply feedback input PSI.

In one embodiment of the parallel amplifier 36, the parallel amplifier 36 provides a parallel amplifier output current IA via the parallel amplifier output PAO. In one embodiment of the parallel switching supply 40, the parallel switching supply 40 provides an assist current IT via the parallel switching supply output PST. In one embodiment of the parallel amplifier 36, the parallel amplifier 36 at least partially provides the envelope power supply voltage EPV via the parallel amplifier output PAO.

In one embodiment of the envelope tracking power supply 26, the offset capacitive element CA is coupled between the envelope power supply output PSO and the parallel amplifier output PAO using other intervening elements (not shown). In one embodiment of the envelope tracking power supply 26, the offset capacitive element CA is coupled between the envelope power supply output PSO and the parallel switching supply output PST using other intervening elements (not shown). In one embodiment of the envelope tracking power supply 26, the offset capacitive element CA is directly coupled between the envelope power supply output PSO and the parallel amplifier output PAO. In one embodiment of the envelope tracking power supply 26, the offset capacitive element CA is directly coupled between the envelope power supply output PSO and the parallel switching supply output PST.

In one embodiment of the envelope tracking power supply 26, the switching circuitry 42 at least partially provides the envelope power supply signal EPS via the first inductive element L1. Additionally, the switching circuitry 42 operates to drive the parallel amplifier output current IA from the parallel amplifier 36 toward zero to increase efficiency. The parallel switching supply 40 operates to further drive the parallel amplifier output current IA from the parallel amplifier 36 toward zero using the assist current IT based on the estimate of the first inductive element current ILF in the first inductive element L1 and the estimate of the load current ILD in the load 46 to further increase efficiency.

The first inductive element L1 and the output filter capacitive element CO may form a low-pass filter to at least partially remove switching ripple produced by ripple current in the first inductive element L1. As such, the output filter capacitive element CO presents a reactive load to the envelope power supply output PSO. While the load 46 may present a largely resistive load to the envelope power supply output PSO, a combination of the load 46 and the output filter capacitive element CO may present a complex load to the envelope power supply output PSO.

In the embodiment shown, the first inductive element L1 is directly coupled between the switching circuitry output SSO and the envelope power supply output PSO. In general, the switching circuitry output SSO is coupled to the envelope power supply output PSO via the first inductive element L1. As such, in other embodiments (not shown), the first inductive element L1 is coupled between the switching circuitry output SSO and the envelope power supply output PSO using other intervening elements (not shown). The switching circuitry 42 provides a switching circuitry output voltage SSV via the switching circuitry output SSO.

In the embodiment shown, the offset capacitive element CA is directly coupled between the parallel amplifier output PAO and the envelope power supply output PSO. In general, the parallel amplifier output PAO is coupled to the envelope power supply output PSO via the offset capacitive element CA. As such, in other embodiments (not shown), the offset capacitive element CA is coupled between the parallel amplifier output PAO and the envelope power supply output PSO using other intervening elements (not shown). In an alternate embodiment of the envelope tracking power supply 26, the offset capacitive element CA and the offset capacitance voltage control loop 44 are omitted, such that the parallel amplifier output PAO is coupled to the envelope power supply output PSO. In an exemplary embodiment of the envelope tracking power supply 26, the offset capacitive element CA and the offset capacitance voltage control loop 44 are omitted, such that the parallel amplifier output PAO is directly coupled to the envelope power supply output PSO.

In the embodiment shown, the first inductive element L1 is directly coupled between the switching circuitry output SSO and the parallel amplifier feedback input FBI. In general, the switching circuitry output SSO is coupled to the parallel amplifier feedback input FBI via the first inductive element L1. As such, in other embodiments (not shown), the first inductive element L1 is coupled between the switching circuitry output SSO and the parallel amplifier feedback input FBI using other intervening elements (not shown). In one embodiment of the output filter capacitive element CO, the output filter capacitive element CO is coupled between the envelope power supply output PSO and a ground.

The parallel amplifier 36 receives the envelope power supply voltage EPV via the parallel amplifier feedback input FBI and drives the envelope power supply voltage EPV toward the setpoint of the envelope power supply voltage EPV using the parallel amplifier feedback input FBI. In one embodiment of the parallel amplifier 36, during envelope tracking, the parallel amplifier 36 at least partially provides the envelope power supply voltage EPV to the RF PA 24 via the envelope power supply output PSO, such that the envelope power supply voltage EPV at least partially tracks the RF transmit signal RFT from the RF PA 24. In one embodiment of the switching supply 38, the switching supply 38 at least partially provides the envelope power supply voltage EPV via the envelope power supply output PSO.

In one embodiment of the envelope tracking power supply 26, the offset capacitance voltage control loop 44 is coupled across the offset capacitive element CA. In one embodiment of the offset capacitance voltage control loop 44, the offset capacitive element CA has an offset capacitive voltage OSV across the offset capacitive element CA, such that the offset capacitive voltage OSV is regulated by the offset capacitance voltage control loop 44. In one embodiment of the offset capacitance voltage control loop 44, the offset capacitive voltage OSV is regulated to be about constant. Further, in one embodiment of the offset capacitance voltage control loop 44, the offset capacitive voltage OSV is further regulated, such that an average DC current through the offset capacitive element CA is equal to about zero.

If the offset capacitive voltage OSV is too high, then the parallel amplifier 36 will be unable to drive a voltage at the parallel amplifier output PAO low enough to provide proper regulation of the envelope power supply voltage EPV. Additionally, if the offset capacitive voltage OSV is too low, then the parallel amplifier 36 will be unable to drive the voltage at the parallel amplifier output PAO high enough to provide proper regulation of the envelope power supply voltage EPV. In this regard, in one embodiment of the offset capacitance voltage control loop 44, the offset capacitance voltage control loop 44 regulates the offset capacitive voltage OSV, such that the parallel amplifier 36 can provide proper regulation of the envelope power supply voltage EPV.

The power supply control circuitry 34 is coupled to each of the parallel amplifier 36, the parallel switching supply 40, the switching circuitry 42, and the offset capacitance voltage control loop 44. As such, in one embodiment of the power supply control circuitry 34, the power supply control circuitry 34 provides information and receives information from any or all of the parallel amplifier 36, the parallel switching supply 40, the switching circuitry 42, and the offset capacitance voltage control loop 44, as needed.

In one embodiment of the envelope tracking power supply 26, the switching circuitry 42 provides a switching output indicator signal SSS and a switching current indicator signal ILS to the parallel switching supply 40. The switching output indicator signal SSS is representative of the switching circuitry output voltage SSV and the switching current indicator signal ILS is representative of the first inductive element current ILF. In one embodiment of the switching output indicator signal SSS, the switching circuitry output voltage SSV is delayed from the switching output indicator signal SSS. As such, the switching output indicator signal SSS provides an early indication of the switching circuitry output voltage SSV. In one embodiment of the parallel switching supply 40, the estimate of the first inductive element current ILF is based on the switching current indicator signal ILS.

Figure 5:
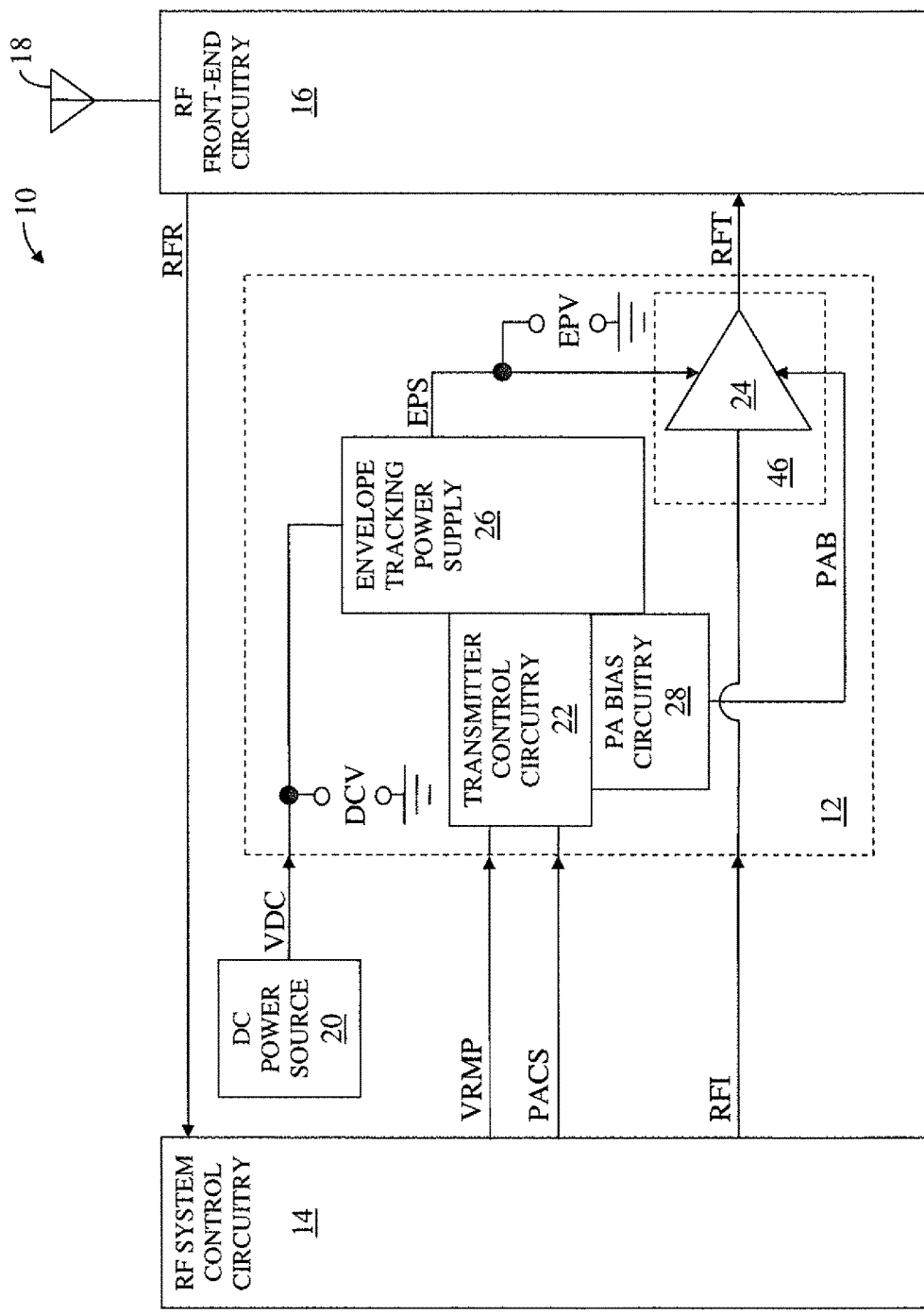
FIG. 5 shows details of the envelope tracking power supply illustrated in FIG. 1 according to an additional embodiment of the envelope tracking power supply.

FIG. 5 shows details of the RF transmitter circuitry 12 illustrated in FIG. 1 according to an additional embodiment of the envelope tracking power supply 26. The RF communications system 10 illustrated in FIG. 5 is similar to the RF communications system 10 illustrated in FIG. 1, except the RF transmitter circuitry 12 illustrated in FIG. 5 further includes the load 46, which includes the RF PA 24.

In one embodiment of the RF communications system 10, the RF communications system 10 communicates according to Institute of Electrical and Electronics Engineers (IEEE) 802.11 communications standards, such that the RF communications system 10 is a Wi-Fi communications system. As such, the RF transmit signal RFT is a Wi-Fi RF transmit signal and the RF receive signal RFR is a Wi-Fi RF receive signal. In an alternate embodiment of the RF communications system 10, the Wi-Fi RF transmit signal, the Wi-Fi RF receive signal, or both are omitted.

FIG. 6 is a graph illustrating the RF transmit signal RFT and the envelope power supply voltage EPV shown in FIGS. 1 and 4 according to one embodiment of the RF transmit signal RFT and the envelope power supply voltage EPV. During envelope tracking, the envelope tracking power supply 26 (FIG. 1) provides the envelope power supply voltage EPV to the RF PA 24 (FIG. 1) via the envelope power supply output PSO (FIG. 4), such that the envelope power supply voltage EPV at least partially tracks the RF transmit signal RFT from the RF PA 24 (FIG. 1), as shown in FIG. 6. In this regard, the RF transmit signal RFT is amplitude modulated and the envelope power supply voltage EPV at least partially follows an envelope of the RF transmit signal RFT, as shown.

Figure 7:
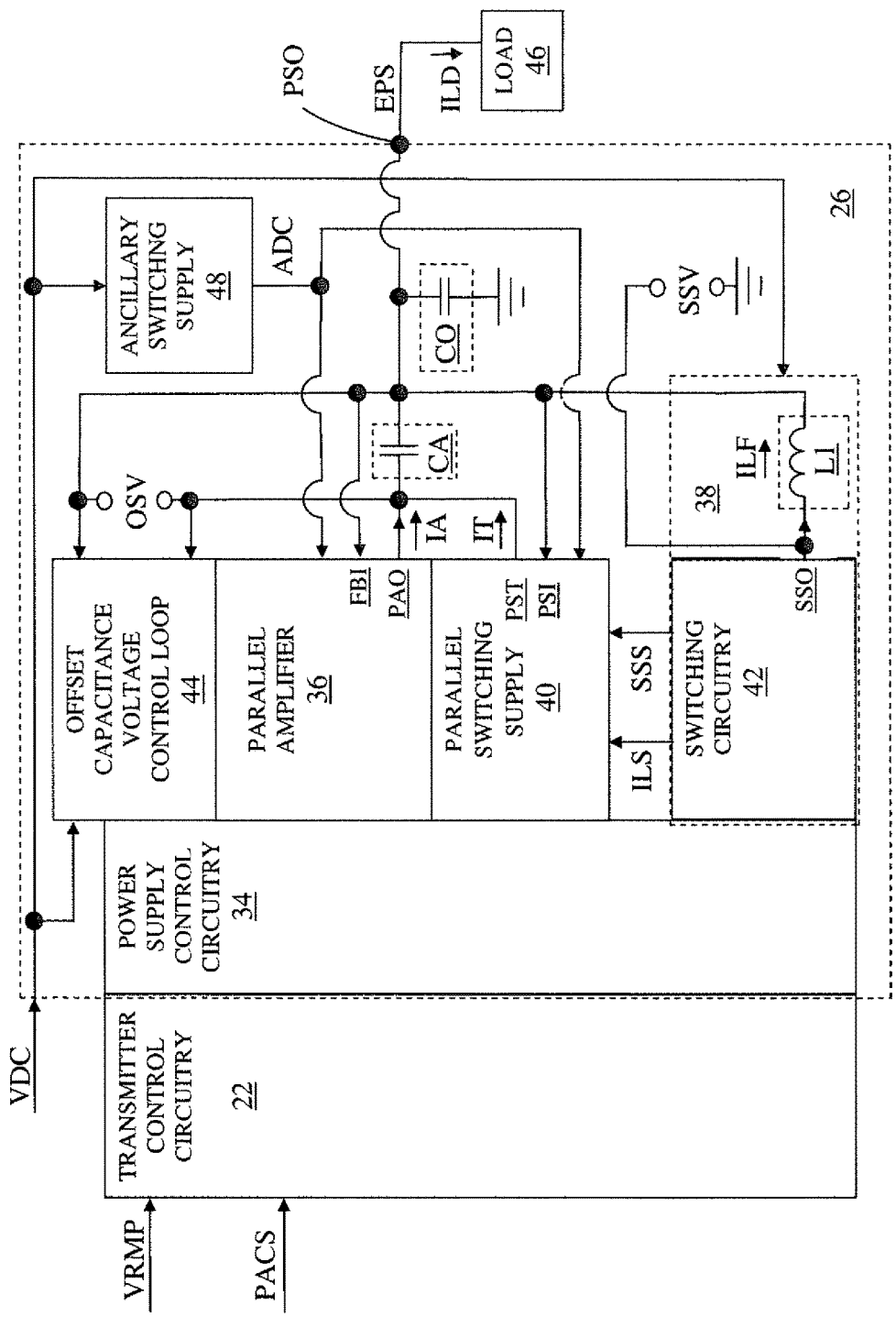
FIG. 7 shows details of the envelope tracking power supply illustrated in FIG. 3 and further shows the load and the transmitter control circuitry according to one embodiment of the load, the transmitter control circuitry, and the envelope tracking power supply.

FIG. 7 shows details of the envelope tracking power supply 26, the transmitter control circuitry 22, and the load 46 illustrated in FIG. 3 according to one embodiment of the envelope tracking power supply 26, the transmitter control circuitry 22, and the load 46. The envelope tracking power supply 26 illustrated in FIG. 7 is similar to the envelope tracking power supply 26 illustrated in FIG. 4, except the envelope tracking power supply 26 illustrated in FIG. 7 further includes an ancillary switching supply 48, which provides an ancillary supply output signal ADC to the parallel amplifier 36 and the parallel switching supply 40 using the DC source signal VDC. In this regard, the ancillary switching supply 48 provides operating power to the parallel amplifier 36 and the parallel switching supply 40 via the ancillary supply output signal ADC instead of the DC power source 20 (FIG. 1) providing the operating power to the parallel amplifier 36 and the parallel switching supply 40 via the DC source signal VDC (FIG. 1).

Figure 8:
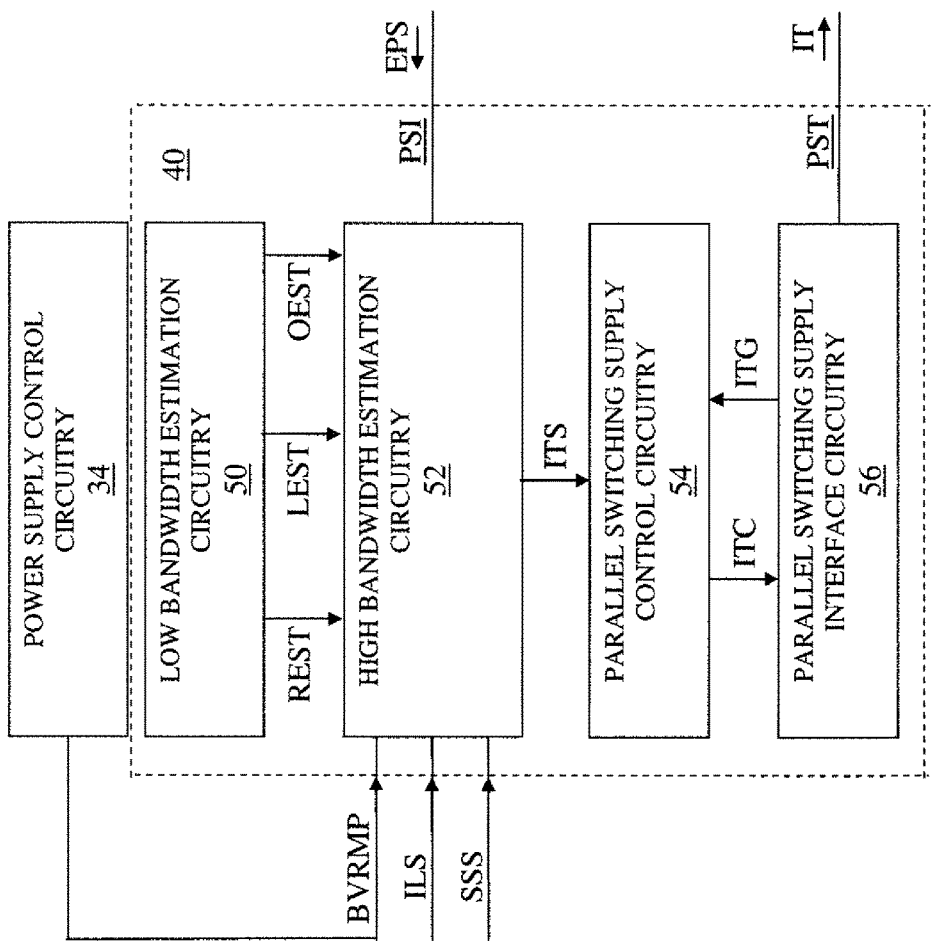
FIG. 8 shows power supply control circuitry and details of a parallel switching supply 40 illustrated in FIG. 7 according to one embodiment of the power supply control circuitry and the parallel switching supply.

FIG. 8 shows the power supply control circuitry 34 and details of the parallel switching supply 40 illustrated in FIG. 7 according to one embodiment of the power supply control circuitry 34 and the parallel switching supply 40. The parallel switching supply 40 has the parallel switching supply feedback input PSI and the parallel switching supply output PST. Further, the parallel switching supply 40 includes low bandwidth estimation circuitry 50, high bandwidth estimation circuitry 52, parallel switching supply control circuitry 54, and parallel switching supply interface circuitry 56.

The high bandwidth estimation circuitry 52 receives the envelope power supply signal EPS (FIG. 7) via the parallel switching supply feedback input PSI. As such, the high bandwidth estimation circuitry 52 receives the envelope power supply voltage EPV (FIG. 1). Further, the high bandwidth estimation circuitry 52 receives the switching current indicator signal ILS (FIG. 7) and the switching output indicator signal SSS (FIG. 7). The parallel switching supply interface circuitry 56 provides the assist current IT via the parallel switching supply output PST. The power supply control circuitry 34 provides a buffered envelope power supply control signal BVRMP based on the envelope power supply control signal VRMP (FIG. 3). As such, the power supply control circuitry 34 provides the setpoint of the envelope power supply voltage EPV (FIG. 1) to the high bandwidth estimation circuitry 52 using the buffered envelope power supply control signal BVRMP.

The low bandwidth estimation circuitry 50 provides an estimated load resistance signal REST, an estimated inductance signal LEST, and an estimated offset voltage signal OEST to the high bandwidth estimation circuitry 52. In general, the low bandwidth estimation circuitry 50 provides a group of low bandwidth estimated signals REST, LEST, OEST to the high bandwidth estimation circuitry 52. In an alternate embodiment of the low bandwidth estimation circuitry 50, any or all of the group of estimated signals REST, LEST, OEST are omitted.

The high bandwidth estimation circuitry 52 provides an assist current setpoint signal ITS to the parallel switching supply control circuitry 54. The parallel switching supply control circuitry 54 provides an assist current control signal ITC to the parallel switching supply interface circuitry 56. The parallel switching supply interface circuitry 56 provides the assist current IT via the parallel switching supply output PST based on the assist current control signal ITC. The parallel switching supply interface circuitry 56 provides an assist current sense signal ITG to the parallel switching supply control circuitry 54 based on the assist current IT. As such, in one embodiment of the parallel switching supply control circuitry 54, the parallel switching supply control circuitry 54 regulates the assist current IT by controlling the assist current control signal ITC using the assist current sense signal ITG as feedback.

In this regard, the parallel switching supply control circuitry 54 and the parallel switching supply interface circuitry 56 provide and regulate the assist current IT based on the assist current setpoint signal ITS. Therefore, the assist current IT is based on the assist current setpoint signal ITS. In one embodiment of the high bandwidth estimation circuitry 52, the high bandwidth estimation circuitry 52 provides the assist current setpoint signal ITS based on the group of low bandwidth estimated signals REST, LEST, OEST, the estimate of the first inductive element current ILF (FIG. 7) in the first inductive element L1 (FIG. 4), and the estimate of the load current ILD (FIG. 7) in the load 46 (FIG. 7).

In one embodiment of the parallel switching supply 40, a bandwidth of the assist current setpoint signal ITS is dominated by the estimate of the first inductive element current ILF (FIG. 7) in the first inductive element L1 (FIG. 4), and the estimate of the load current ILD (FIG. 7) in the load 46 (FIG. 7). Therefore, the bandwidth of the assist current setpoint signal ITS may be significantly higher than a bandwidth of each of the group of low bandwidth estimated signals REST, LEST, OEST.

In one embodiment of the parallel switching supply 40, the bandwidth of the assist current setpoint signal ITS is at least two times the bandwidth of each of the group of low bandwidth estimated signals REST, LEST, OEST. In one embodiment of the parallel switching supply 40, the bandwidth of the assist current setpoint signal ITS is at least five times the bandwidth of each of the group of low bandwidth estimated signals REST, LEST, OEST. In one embodiment of the parallel switching supply 40, the bandwidth of the assist current setpoint signal ITS is at least ten times the bandwidth of each of the group of low bandwidth estimated signals REST, LEST, OEST.

In this regard, operating behavior of the parallel switching supply 40 due to the relatively high bandwidth of the assist current setpoint signal ITS is significantly closed loop. However, operating behavior of the parallel switching supply 40 due to the relatively low bandwidth of each of the group of estimated signals REST, LEST, OEST is significantly open loop. Therefore, the operating behavior of the parallel switching supply 40 due to both the high bandwidth of the assist current setpoint signal ITS and the low bandwidth of group of estimated signals REST, LEST, OEST is defined as semi-open loop.

In one embodiment of the parallel switching supply 40, the estimated inductance signal LEST is representative of an estimated inductance of the first inductive element L1 (FIG. 7), such that the estimate of the first inductive element current ILF (FIG. 7) in the first inductive element L1 (FIG. 7) is based on the estimated inductance signal LEST. In one embodiment of the parallel switching supply 40, the estimated load resistance signal REST is representative of an estimated load resistance of the load 46 (FIG. 7), such that the estimate of the load current ILD (FIG. 7) in the load 46 (FIG. 7) is based on the estimated load resistance signal REST.

In one embodiment of the parallel switching supply 40, the offset capacitive element CA is coupled between the envelope power supply output PSO and the parallel switching supply output PST. The estimated offset voltage signal OEST is representative of the offset capacitive voltage OSV. The assist current IT is further based on the estimated offset voltage signal OEST.

In one embodiment of the parallel switching supply 40, the high bandwidth estimation circuitry 52 provides the assist current setpoint signal ITS based on the envelope power supply voltage EPV (FIG. 1), the setpoint of the envelope power supply voltage EPV (FIG. 1), the estimate of the first inductive element current ILF (FIG. 7) in the first inductive element L1 (FIG. 4), and the estimate of the load current ILD (FIG. 7) in the load 46 (FIG. 7).

In one embodiment of the parallel switching supply 40, the high bandwidth estimation circuitry 52 provides the assist current setpoint signal ITS based on the switching current indicator signal ILS, the estimate of the first inductive element current ILF (FIG. 7) in the first inductive element L1 (FIG. 4), and the estimate of the load current ILD (FIG. 7) in the load 46 (FIG. 7).

In one embodiment of the parallel switching supply 40, the high bandwidth estimation circuitry 52 provides the assist current setpoint signal ITS based on the switching output indicator signal SSS, the estimate of the first inductive element current ILF (FIG. 7) in the first inductive element L1 (FIG. 4), and the estimate of the load current ILD (FIG. 7) in the load 46 (FIG. 7). In one embodiment of the parallel switching supply 40, the parallel switching supply 40 is a buck only switching supply.

Figure 9A:
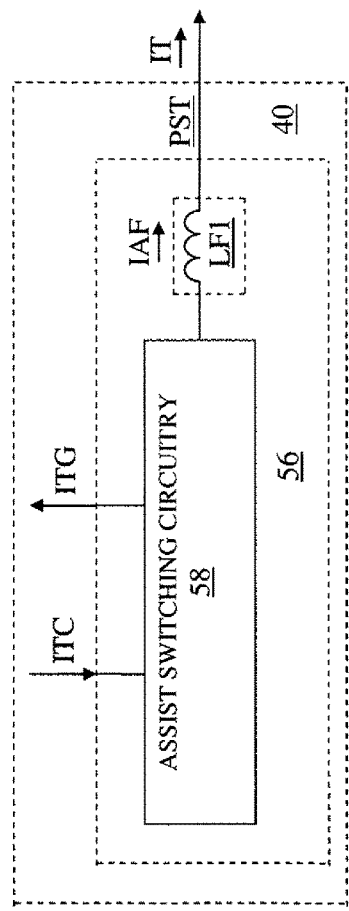
FIG. 9A shows a portion of the parallel switching supply illustrated in FIG. 8 according to one embodiment of the parallel switching supply.

FIG. 9A shows a portion of the parallel switching supply 40 illustrated in FIG. 8 according to one embodiment of the parallel switching supply 40. The portion of the parallel switching supply 40 illustrated in FIG. 9A has the parallel switching supply output PST and includes the parallel switching supply interface circuitry 56. The parallel switching supply interface circuitry 56 includes assist switching circuitry 58 and a first assist inductive element LF1. The first assist inductive element LF1 is coupled between the assist switching circuitry 58 and the parallel switching supply output PST. The first assist inductive element LF1 has first assist inductive element current IAF, which is the assist current IT.

Figure 9B:
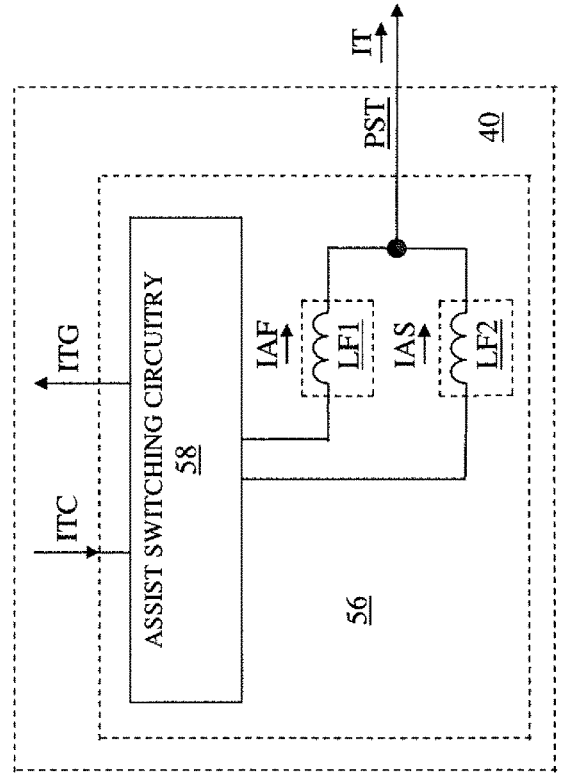
FIG. 9B shows a portion of the parallel switching supply illustrated in FIG. 8 according to an alternate embodiment of the parallel switching supply.

FIG. 9B shows a portion of the parallel switching supply 40 illustrated in FIG. 8 according to an alternate embodiment of the parallel switching supply 40. The parallel switching supply 40 illustrated in FIG. 9B is similar to the parallel switching supply 40 illustrated in FIG. 9A, except in the parallel switching supply 40 illustrated in FIG. 9B, the parallel switching supply interface circuitry 56 further includes a second assist inductive element LF2, which is coupled between the assist switching circuitry 58 and the parallel switching supply output PST. The second assist inductive element LF2 has a second assist inductive element current IAS.

The assist current IT is based on a combination of the first assist inductive element current IAF and the second assist inductive element current IAS. In one embodiment of the parallel switching supply 40, the parallel switching supply 40 is a dual phase switching supply, such that the second assist inductive element current IAS is phase-shifted from the first assist inductive element current IAF.

Those skilled in the art will recognize improvements and modifications to the embodiments of the present disclosure. All such improvements and modifications are considered within the scope of the concepts disclosed herein and the claims that follow.

What is claimed is:

1. An envelope tracking power supply configured to provide an envelope power supply signal to a load via an envelope power supply output, and comprising:
   a parallel amplifier having a parallel amplifier output and configured to regulate an envelope power supply voltage of the envelope power supply signal based on a setpoint of the envelope power supply voltage;
   switching circuitry configured to at least partially provide the envelope power supply signal via a first inductive element and drive an output current from the parallel amplifier toward zero;
   a parallel switching supply having a parallel switching supply output and configured to provide an assist current to further drive the output current from the parallel amplifier toward zero based on an estimate of a current in the first inductive element and an estimate of a current in the load; and
   an offset capacitive element coupled between the parallel amplifier output and the envelope power supply output and coupled between the parallel switching supply output and the envelope power supply output.

2. The envelope tracking power supply of claim 1 wherein a switching supply comprises the switching circuitry and the first inductive element, such that a bandwidth of the parallel amplifier is greater than a bandwidth of the parallel switching supply and the bandwidth of the parallel switching supply is greater than a bandwidth of the switching supply.

3. The envelope tracking power supply of claim 2 wherein the bandwidth of the switching supply is less than 8 megahertz, the bandwidth of the parallel switching supply is less than 40 megahertz, and the bandwidth of the parallel amplifier is greater than 40 megahertz.

4. The envelope tracking power supply of claim 1 wherein a switching supply comprises the switching circuitry and the first inductive element, which is coupled between the switching circuitry and the envelope power supply output, such that the envelope tracking power supply is further configured to provide the envelope power supply signal via the envelope power supply output.

5. The envelope tracking power supply of claim 1 wherein the parallel switching supply output is directly coupled to the parallel amplifier output.

6. The envelope tracking power supply of claim 1 further comprising an offset capacitance voltage control loop coupled across the offset capacitive element and configured to regulate a voltage across the offset capacitive element.

7. The envelope tracking power supply of claim 1 wherein the load comprises a radio frequency (RF) power amplifier (PA) configured to receive and amplify an RF input signal to provide an RF transmit signal using the envelope power supply signal.

8. The envelope tracking power supply of claim 1 further comprising an ancillary switching supply configured to provide operating power to the parallel amplifier and the parallel switching supply via an ancillary supply output signal.

9. The envelope tracking power supply of claim 1 wherein the switching circuitry is further configured to provide a switching current indicator signal to the parallel switching supply, such that the switching current indicator signal is representative of the current in the first inductive element and the estimate of the current in the first inductive element is based on the switching current indicator signal.

10. The envelope tracking power supply of claim 1 wherein the parallel switching supply comprises low bandwidth estimation circuitry configured to provide an estimated inductance signal, which is representative of an estimated inductance of the first inductive element, such that the estimate of the current in the first inductive element is based on the estimated inductance signal.

11. The envelope tracking power supply of claim 1 wherein the parallel switching supply comprises low bandwidth estimation circuitry configured to provide an estimated load resistance signal, which is representative of an estimated load resistance of the load, such that the estimate of the current in the load is based on the estimated load resistance signal.

12. The envelope tracking power supply of claim 1 wherein:
the parallel switching supply comprises low bandwidth estimation circuitry configured to provide an estimated offset voltage signal, which is representative of an offset capacitive voltage across the offset capacitive element; and
the assist current is further based on the estimated offset voltage signal.

13. The envelope tracking power supply of claim 1 wherein:
the parallel switching supply further comprises low bandwidth estimation circuitry and high bandwidth estimation circuitry;
the low bandwidth estimation circuitry is configured to provide a plurality of low bandwidth estimated signals to the high bandwidth estimation circuitry;
the high bandwidth estimation circuitry is configured to provide an assist current setpoint signal based on the plurality of low bandwidth estimated signals, the estimate of the current in the first inductive element, and the estimate of the current in the load;
a bandwidth of the assist current setpoint signal is at least two times a bandwidth of each of the plurality of low bandwidth estimated signals; and
the assist current is further based on the assist current setpoint signal.

14. The envelope tracking power supply of claim 1 wherein:
the parallel switching supply further comprises high bandwidth estimation circuitry;
the high bandwidth estimation circuitry is configured to receive the envelope power supply signal and the setpoint of the envelope power supply voltage;
the high bandwidth estimation circuitry is further configured to provide an assist current setpoint signal based on the envelope power supply voltage, the setpoint of the envelope power supply voltage, the estimate of the current in the first inductive element, and the estimate of the current in the load; and
the assist current is further based on the assist current setpoint signal.

15. The envelope tracking power supply of claim 1 wherein:
the parallel switching supply further comprises high bandwidth estimation circuitry;
the high bandwidth estimation circuitry is configured to receive a switching current indicator signal;
the high bandwidth estimation circuitry is further configured to provide an assist current setpoint signal based on the switching current indicator signal, the estimate of the current in the first inductive element, and the estimate of the current in the load; and
the assist current is further based on the assist current setpoint signal.

16. The envelope tracking power supply of claim 1 wherein:
the parallel switching supply further comprises high bandwidth estimation circuitry;
the high bandwidth estimation circuitry is configured to receive a switching output indicator signal;
the high bandwidth estimation circuitry is further configured to provide an assist current setpoint signal based on the switching output indicator signal, the estimate of the current in the first inductive element, and the estimate of the current in the load; and
the assist current is further based on the assist current setpoint signal.

17. The envelope tracking power supply of claim 1 wherein:
the parallel switching supply comprises assist switching circuitry;
the parallel switching supply further comprises a first assist inductive element coupled between the assist switching circuitry and the parallel switching supply output; and
the first assist inductive element has a first assist inductive element current, which is the assist current.

18. The envelope tracking power supply of claim 1 wherein:
the parallel switching supply comprises assist switching circuitry;

the parallel switching supply further comprises a first assist inductive element coupled between the assist switching circuitry and the parallel switching supply output;

the parallel switching supply further comprises a second assist inductive element coupled between the assist switching circuitry and the parallel switching supply output;

the first assist inductive element has a first assist inductive element current;

the second assist inductive element has a second assist inductive element current; and the assist current is based on a combination of the first assist inductive element current and the second assist inductive element current.

19. The envelope tracking power supply of claim 18 wherein the parallel switching supply is a dual phase switching supply, such that the second assist inductive element current is phase-shifted from the first assist inductive element current.

* * * * *